United States Patent [19]

Lee et al.

[11] Patent Number: 5,319,158
[45] Date of Patent: Jun. 7, 1994

[54] COIL INTEGRATED SEMI-CONDUCTOR DEVICE AND METHOD OF MAKING THE SAME

[75] Inventors: Kyung S. Lee, Kyungi-do; Heung S. Kim, Kyungki-do, both of Rep. of Korea

[73] Assignee: Goldstar Electron Co., Ltd., Rep. of Korea

[21] Appl. No.: 912,143

[22] Filed: Jul. 10, 1992

[30] Foreign Application Priority Data

Jul. 11, 1991 [KR] Rep. of Korea ............... 11805/1991

[51] Int. Cl.$^5$ .............................................. H05K 1/00
[52] U.S. Cl. ............................ 174/250; 174/35 C E; 174/257; 174/262; 257/659
[58] Field of Search ................. 174/250, 260, 261, 32, 174/35 R, 35 CE, 262, 257; 257/659, 660

[56] References Cited

U.S. PATENT DOCUMENTS 4,673,904 6/1987 Landis ................................ 174/261
5,012,125 4/1991 Conway.

OTHER PUBLICATIONS

Nguyen and Meyers,*SI IC-Compatible inductors and LC Passive Filters,* IEEE Journal of Solid State Circuits, vol. 25, No. 4, Aug. 1990.
Howe, et al., Silicon Micromechanics: Sensors and Actuators On A Chip, IEEE Spectrum, Jul. 1990.

*Primary Examiner*—Leo P. Picard
*Assistant Examiner*—Cheryl R. Figlin
*Attorney, Agent, or Firm*—Poms, Smith, Lande & Rose

[57] ABSTRACT

A coil integrated semi-conductor device and method of making the same is disclosed. First to third metal layers are in sequence formed on a semi-conductor device. The first and third metal layers of equal width are connected to each other through contact holes, to define a hollow region which is filled with the second metal layer disposed centrally therein and a circumferential region surrounding the second metal layer. The first and third metal layers are used as a coil and the second metal layer is used as a core of magnetic material. The circumferential region surrounding the second metal layer is filled with different dielectric layers. According to the invention, a coil capable of exerting the magnetic field effect can be integrated in a semiconductor chip. This makes it possible contemplation of compactness, integration and preciseness of devices in the form that the coil is wound around the care. Therefore, the present invention is applicable to various systems in which the magnetic field caused by the current and the current induced by the magnetic field are utilized respectively. More particularly, the present invention is applicable to an oscillator, a small capacity motor, a magnetic field sensor and the like, as the form of the semi-conductor device.

16 Claims, 4 Drawing Sheets

COIL INTEGRATED SEMI-CONDUCTOR DEVICE AND METHOD OF MAKING THE SAME

BACKGROUND OF THE INVENTION

1. Field of the Invention

The present invention relates in general to a coil integrated semi-conductor device and method of making the same, and more particularly to a semi-conductor device and method of making the same, wherein a coil is integrated in the semi-conductor device by using a technique of making a semi-conductor integrated circuit having a multi-layer wired structure, so that electric and magnetic fields caused by current are applicable to both internal and external elements of the semi-conductor device.

2. Description of the Prior Art

Conventionally, there have not been proposed any semi-conductor devices applicable to various circuits in which a magnetic field caused by current and current induced by a magnetic field are utilized respectively.

SUMMARY OF THE INVENTION

Therefore, the present invention has been made in view of the above problem, and it is an object of the present invention to provide a semi-conductor device and method of making the same, wherein a coil is integrated in the semi-conductor device by using a technique of making a semi-conductor integrated circuit having a multi-layer wired structure.

It is another object of the present invention to provide a coil integrated semi-conductor device and method of making the same, wherein electric and magnetic fields caused by current are applicable to both internal and external elements of the semi-conductor device.

In accordance with one aspect of the present invention, there is provided a coil integrated semi-conductor device, comprising: a semi-conductor substrate; a first dielectric layer formed on said semi-conductor substrate; a first metal layer formed on said first dielectric layer, said first metal layer having a predetermined width; a hair of first contact holes defined respectively on both edges of said first metal layer; a second metal layer having a central portion formed centrally over said first metal layer and opposed side portions formed respectively on said first contact holes, said second metal layer having a width narrower than that of said first metal layer; a pair of second contact holes defined respectively on said side portions of said second metal layer, said first and second contact holes having the same width; a third metal layer formed over said second metal layer, said third metal layer having the same width as that of said first metal layer; and second and third dielectric layers; said first and third metal layers being connected to each other through said first and second contact holes and by said side portions of the second metal layer formed therebetween, to define a hollow region which is filled with said central portion of the second metal layer disposed centrally therein and a circumferential region surrounding the central portion, said circumferential region being filled with said second dielectric layer at its bottom portion and with said third dielectric layer at the remaining portion.

In accordance with another object of the present invention, there is provided a method of making a coil integrated semi-conductor device, comprising the steps of: forming in sequence a first dielectric layer and a first metal layer an a semi-conductor substrate; photoetching said first metal layer to pattern it; coating a second dielectric layer over the resulting exposed entire surface on said semi-conductor substrate; photoetching said second dielectric layer to define a pair of first contact holes; applying a second metal layer over the resulting exposed entire surface on the semi-conductor substrate; photoetching said second metal layer to pattern it leaving its central portion formed centrally on said second dielectric layer portion on the patterned first metal layer and its opposed side portions formed respectively on the first contact holes; coating a third dielectric layer over the resulting exposed entire surface on the semi-conductor substrate; photoetching said third dielectric layer to define a pair of second contact holes respectively on said side portions of said second metal layer; applying a third metal layer over the resulting exposed entire surface on the semi-conductor substrate; photoetching said third metal layer to pattern it such that it is vertically aligned with and above the patterned first metal layer and has the same width as that of the patterned first metal layer; and coating a protective film over the resulting exposed entire surface on the semi-conductor substrate.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Referring to FIGS. 1A through 1F, there are shown sectional views illustrating in sequence the various steps of a method of making a coil integrated semi-conductor device in accordance with an embodiment of the present invention.

Figure 1A:
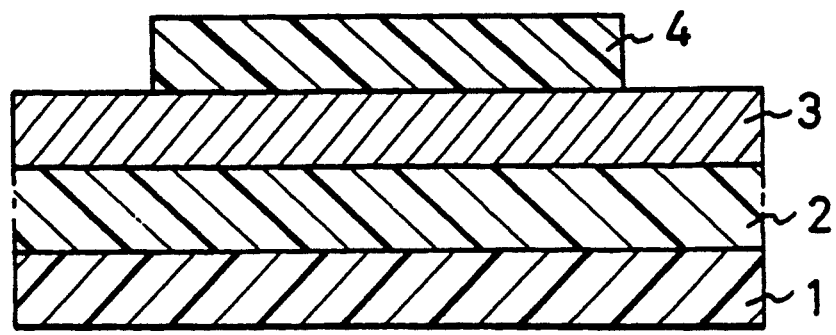
FIGS. 1A through 1F are sectional views illustrating in sequence the various steps of a method of making a coil integrated semi-conductor device in accordance with an embodiment of the present invention.

As shown in FIG. 1A, first deposited on a semi-conductor substrate 1 is a first dielectric layer 2 on which a first metal layer 3 are then deposited. A photoresist layer 4 is coated on the first metal layer 3 and then etched to be patterned leaving a desired portion thereof.

Figure 1B:
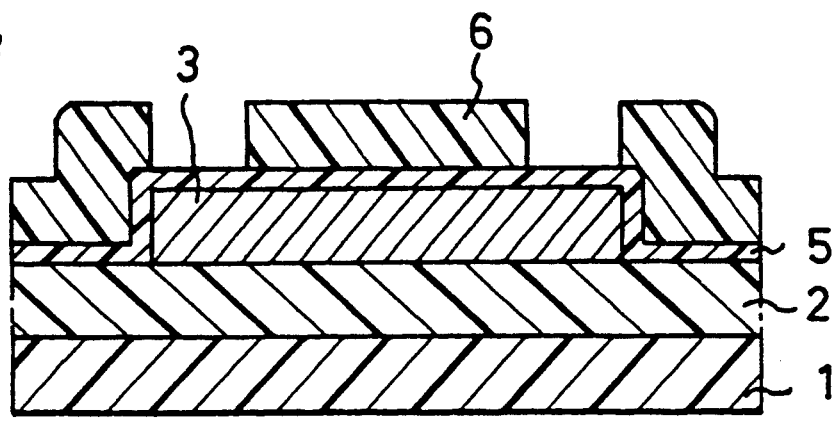

In FIG. 1B, the first metal layer 3 is photoetched using the patterned photoresist layer 4, to form a desired metal pattern thereof. Thereafter, the patterned photoresist layer 4 is removed and a second dielectric layer 5 is then deposited over the resulting exposed entire surface on the semi-conductor substrate 1. A new photoresist layer 6 is applied on the second dielectric layer 5 and then etched to be patterned leaving its desired portions except portions over both edges of the patterned first metal layer 3 where a pair of first contact holes 7 are to be defined respectively as will be mentioned later.

Figure 1C:
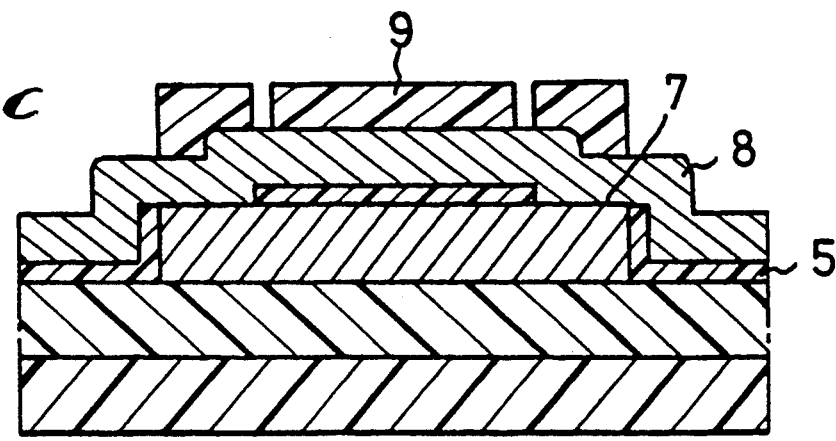

The patterned first metal layer 3 is exposed by photoetching the second dielectric layer 5 thereon using the patterned photoresist layer 6, as shown in FIG. 1C, thereby to define the two first contact holes 7 respectively on the exposed edge surfaces thereof through which the patterned first metal layer 3 is in contact with a second metal layer 8 as will be formed later. After removing the patterned photoresist layer 6, the second metal layer 8 of magnetic material is deposited over the resulting exposed entire surface on the semi-conductor substrate 1. A different photoresist layer 9 is coated on the second metal layer 8 and then etched to be patterned leaving its desired portions over the second dielectric layer 5 portion on the patterned first metal layer 3 and over both the edge portions of the patterned first metal layer 3, or the first contact holes 7. In accordance with the preferred embodiment of the present invention, the second metal layer 8 may be of a nickel Ni.

Figure 1D:
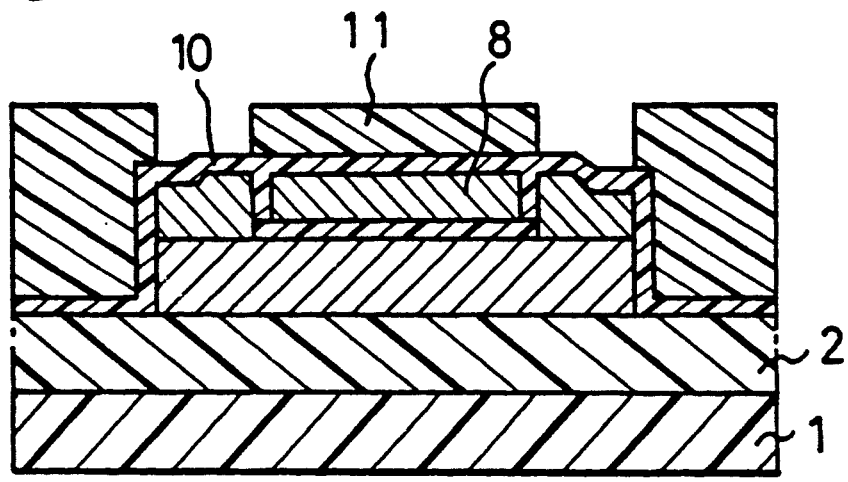

In FIG. 1D, the second metal layer 8 is photoetched using the patterned photoresist layer 9, to be patterned leaving its desired portions, I.E. its central portion formed on the second dielectric layer 5 portion on the patterned first metal layer 3 and its opposed side portions formed respectively on the two first contact holes 7. In accordance with the preferred embodiment of the present invention, the central portion of the second metal layer 8 formed on the second dielectric layer 5 portion on the patterned first metal layer 3 may be used as a core and the side portions of the second metal layer 8 formed on the first contact holes 7 act to connect the patterned first metal layer 3 with a third metal layer 13 as will be formed later.

After removing the patterned photoresist layer 9, a third dielectric layer 10 is deposited over the resulting exposed entire surface on the semi-conductor substrate 1 and another photoresist layer 11 is then applied on the third dielectric layer 10. The photoresist layer 11 is etched to be patterned such that only portions of the third dielectric layer 10 over the two first contact holes 7 are exposed.

Figure 1E:
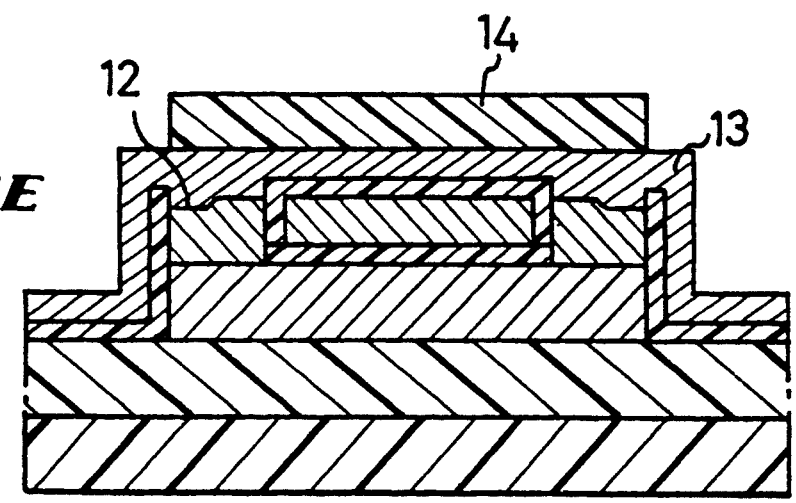

As shown in FIG. 1E, only surfaces of the side portions of the second metal layer 8 formed on the two first contact holes 7 are exposed by photoetching the third dielectric layer 10 thereon using the patterned photoresist layer 11, thereby to define a pair of second contact holes 12 respectively thereon such that they are vertically aligned with and above the first contact holes 7. Herein, the first and second contact holes 7 and 12 have the same width.

Figure 1F:
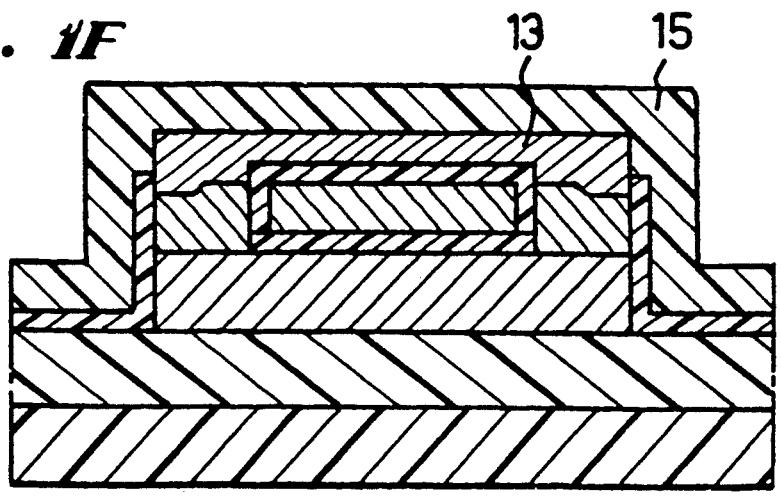

The patterned photoresist layer 11 is removed and the third metal layer 13 is then deposited over the resulting exposed entire surface on the semi-conductor substrate 1. Thereafter, a new photoresist layer 14 is applied on the third metal layer 13 and then etched to be patterned such that it has the same width as that of the patterned first metal layer 3. The third metal layer 13 is photoetched using the patterned photoresist layer 14, to form a desired metal pattern thereof such that it is vertically aligned with and above the patterned first metal layer 3. Herein, the patterned third metal layer 13 has the same width as that of the patterned first metal layer 3. After removing the patterned photoresist layer 14, a protective film 15 is coated over the resulting exposed entire surface on the semi-conductor substrate 1, as shown in FIG. 1F. As a result, the coil integrated semi-conductor device can be made as shown in FIG. 1F.

Referring again to FIG. 1F which illustrates a completed form of the coil integrated semi-conductor device in accordance with the embodiment of the present invention, the coil integrated semi-conductor device comprises the semi-conductor substrate 1, over the entire surface of which the first dielectric layer 2 is formed. The first to third metal layers 3, 8 and 13 are in sequence formed on the first dielectric layer 2. The pair of first contact holes 7 are defined respectively on the both edges of the first metal layer 3. The second metal layer 8 is patterned to have the central portion formed centrally over the first metal layer 3 and the opposed side portions formed respectively on the first contact holes 7. The pair of second contact holes 12 are defined respectively on the side portions of the second metal layer 8. The first and second contact holes 7 and 12 are of the same width. The first and third metal layers 3 and 13 of equal width are connected to each other through the first and second contact holes 7 and 12 and by the side portions of the second metal layer 8 formed between the first and second contact holes 7 and 12, to define a hollow region which is filled with the central portion of the second metal layer 8 disposed centrally therein and a circumferential region surrounding the central portion of the second metal layer 8. In accordance with the preferred embodiment of the present invention, the first and third metal layers 3 and 13 may be used as a coil and the central portion of the second metal layer 8 may be used as a core of magnetic material. The circumferential region surrounding the central portion of the second metal layer 8 is filled with the second dielectric layer 5 at its bottom portion and with the third dielectric layer 10 at the remaining portion.

Referring to FIGS. 2A through 2D, there are shown sectional views illustrating in sequence the various steps of a method of making a coil integrated semi-conductor device in accordance with an alternative embodiment of the present invention.

Figure 2A:
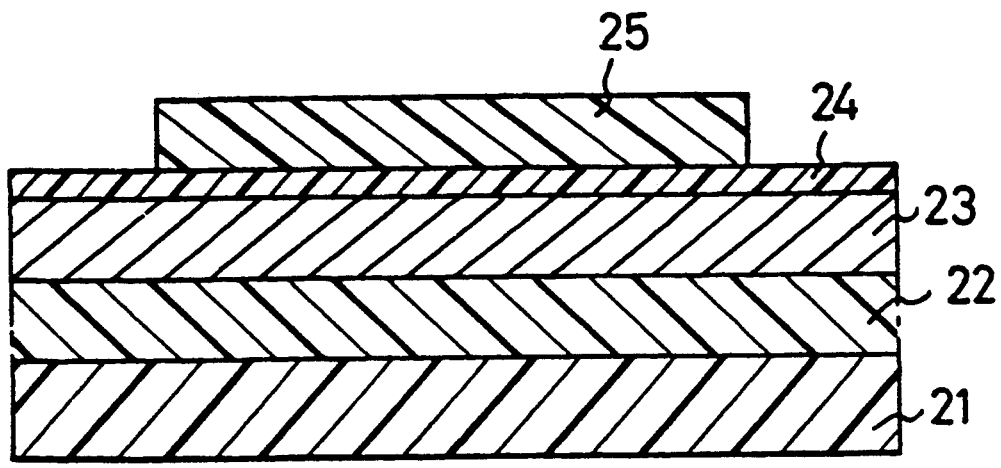
FIGS. 2A through 2D are sectional views illustrating in sequence the various steps of a method of making a coil integrated semi-conductor device in accordance with an alternative embodiment of the present invention.

First, an oxide film 22, a first metal layer 23 and a first dielectric layer 24 are in sequence applied on a silicon substrate 21, using a chemical vapor deposition (CVD) technique or a sputtering technique, as shown in FIG. 2A. A photoresist layer 25 is coated on the first dielectric layer 24 and then etched to be patterned leaving a desired portion thereof.

Figure 2B:
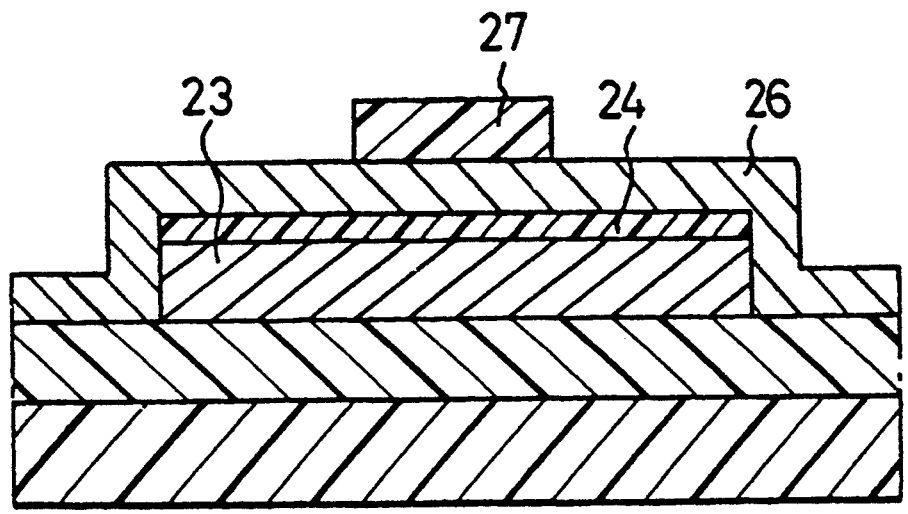

In FIG. 2B, the first dielectric layer 24 and the first metal layer 23 are in sequence photoetched using the patterned photoresist layer 25, to form their desired dielectric and metal patterns of equal width. Thereafter, the patterned photoresist layer 25 is removed and a second metal layer 26 of magnetic material is then deposited over the resulting exposed entire surface on the silicon substrate 21. A new photoresist layer 27 is applied on the second metal layer 26 and then etched to be patterned leaving a desired portion thereof which is disposed centrally over the patterned first metal layer 23 and has a width narrower than that of the patterned first metal layer 23. In accordance with the preferred embodiment of the present invention, the second metal layer 26 may be of a nickel Ni.

Figure 2C:
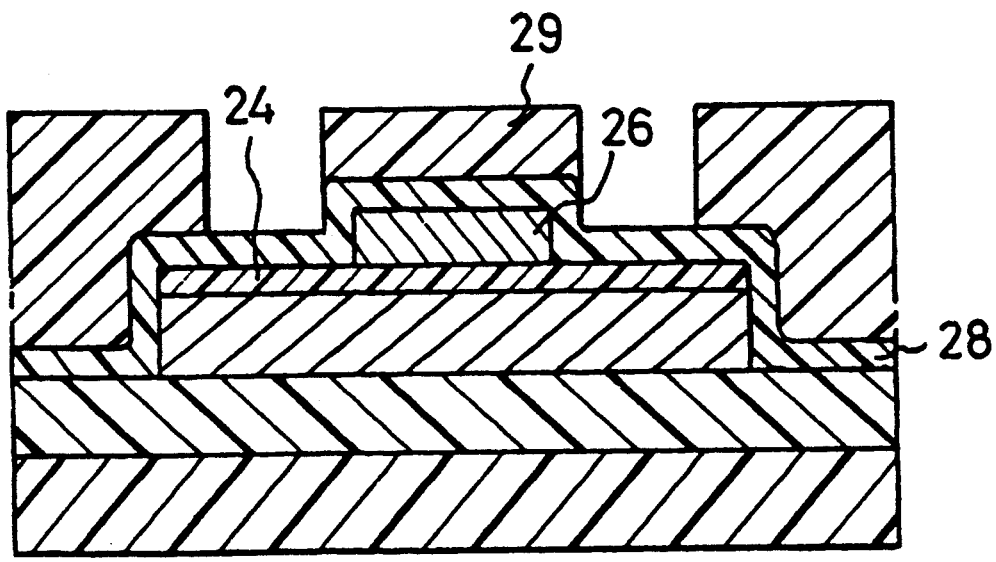

As shown in FIG. 2C, the second metal layer 26 is photoetched using the patterned photoresist layer 27, to be patterned leaving a desired metal portion thereof which is disposed centrally over the patterned first metal layer 23 and has a width narrower than that of the patterned first metal layer 23. In accordance with the preferred embodiment of the present invention, the patterned second metal layer 26 over the patterned first metal layer 23 may be used as a core.

After removing the patterned photoresist layer 27, a second dielectric layer 28 is deposited over the resulting exposed entire surface on the silicon substrate 21. A different photoresist layer 29 is coated on the second dielectric layer 28 and then etched to be patterned leaving its desired portions except portions over both side portions of the patterned first metal layer 23.

Figure 2D:
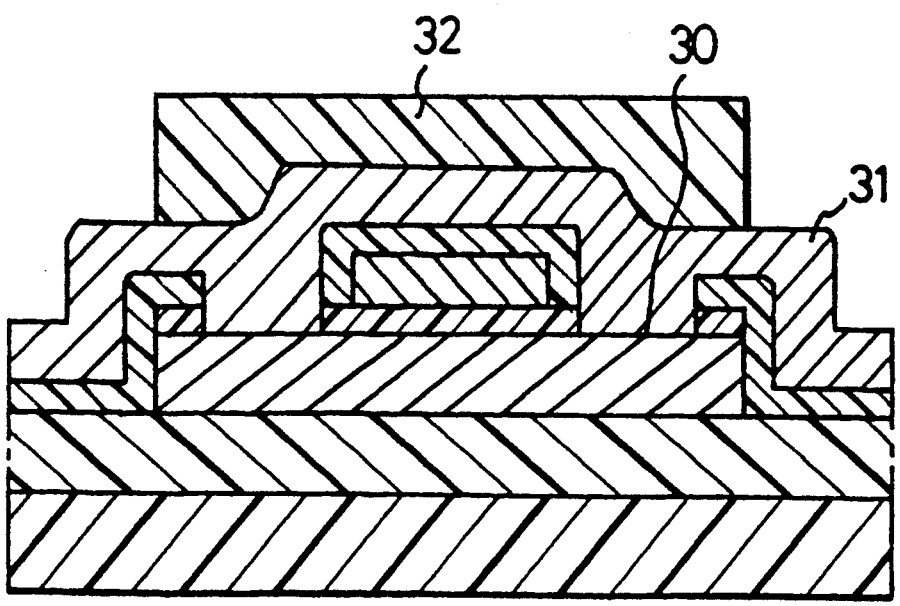

The patterned first metal layer 23 is exposed by sequentially photoetching the second and first dielectric layers 28 and 24 thereon using the patterned photoresist layer 29, as shown in FIG. 2D, thereby to define a pair of contact holes 30 respectively on the exposed side surfaces thereof through which the patterned first metal layer 23 is in contact with a third metal layer 31 as will be formed later.

The patterned photoresist layer 29 is removed and the third metal layer 31 is then deposited over the resulting exposed entire surface on the silicon substrate 21. Another photoresist layer 32 is coated on the third metal layer 31 and then etched to be patterned such that it has the same width as that of the patterned first metal layer 23. The third metal layer 31 is photoetched using the patterned photoresist layer 32, to form a desired metal pattern thereof such that it is vertically aligned with and above the patterned first metal layer 23, in the same manner as that in the first embodiment of the present invention. Herein, the patterned third metal layer 31 has the same width as that of the patterned first metal layer 23. After removing the patterned photoresist layer 32, a protective film is coated over the resulting exposed entire surface on the silicon substrate 21, in the same manner as that in the first embodiment. As a result, the coil integrated semi-conductor device can be made.

As mentioned above, in accordance with the alternative embodiment of the present invention, the pair of contact holes 30 are defined respectively on the both side portions of the first metal layer 23. The first and third metal layers 23 and 31 of equal width are connected to each other directly through the contact holes 30, to define a hollow region which is filled with the second metal layer 26 disposed centrally therein and a circumferential region surrounding the second metal layer 26. The first and third metal layers 23 and 31 may be used as a coil and the second metal layer 26 may be used as a care of magnetic material. The circumferential region surrounding the second metal layer 26 is filled with the first dielectric layer 24 at its bottom portion and with the second dielectric layer 28 at the remaining portion. In result, there can be made such a shape that the coil is wound around the core.

Referring again to FIG. 2D which illustrates a completed form of the coil integrated semi-conductor device in accordance with the alternative embodiment of the present invention, although not illustrating the final step equal to that in the first embodiment, the coil integrated semi-conductor device comprises the semi-conductor substrate 21, over the entire surface of which the oxide film 22 is formed. The first to third metal layers 23, 26 and 31 are in sequence formed on the oxide film 22. The second metal layer 26 is patterned to be formed centrally over the first metal layer 23. The contact holes 30 are defined respectively on the both side portions of the first metal layer 23. The first and third metal layers 23 and 31 of equal width are connected to each other directly through the contact holes 30, to define the hollow region which is filled with the second metal layer 26 disposed centrally therein and the circumferential region surrounding the second metal layer 26. In accordance with the preferred embodiment of the present invention, the first and third metal layers 23 and 31 may be used as a coil and the second metal layer 26 may be used as a core of magnetic material. The circumferential region surrounding the second metal layer 26 is filled with the first dielectric layer 24 at its bottom portion and with the second dielectric layer 28 at the remaining portion.

In the first embodiment of the present invention, as mentioned previously with reference to FIGS. 1A to 1F, the first and second contact holes 7 and 12 are defined respectively on the both edges of the first metal layer 3 and the first and third metal layers 3 and 13 are connected to each other by the side portions of the second metal layer 8 formed between the first and second contact holes 7 and 12, thereby leaving the hollow region defined. On the other hand, in the second embodiment of the present invention, as mentioned above with reference to FIGS. 2A to 2D, the contact holes 30 are defined respectively on the both side portions of the first metal layer 23 and the first and third metal layers 23 and 31 are connected to each other directly through the contact holes 30, thereby leaving the hollow region defined.

The semi-conductor device with the above-mentioned structures in accordance with the first and second embodiments of the present invention acts equally to a device in the general form that a coil is wound around a bar of desired material. Namely, with current flowing through the coil, a magnetic field is built up as expressed by the following equation (1) depending on an Ampere Circultal Law.

$$H = NI/d \qquad (1)$$

Where, H is an intensity of the magnetic field, N is the number of turns of the coil and d is a length of the coil.

As a result, it can be seen from the above equation (1) that a proportional constant between the intensity of the magnetic field and the amount of the current is determined by regulating the number of the turns and the length of the coil in making the semi-conductor device. The proportional relation between the intensity of the magnetic field and the amount of the current is thus determined according to the determined proportional constant, thereby enabling either a desired amount of current to be induced by a magnetic field or a desired intensity of magnetic field to be caused by current.

As hereinbefore described, according to the present invention, in the semi-conductor device, there can be integrated the coil-shaped portion capable of exerting the electric and magnetic field effects. This makes it possible contemplation of compactness, integration and preciseness of devices in the form that the coil is wound around the core. Therefore, the coil integrated semi-conductor device of the present invention can be applied to various systems in which the magnetic field caused by the current and the current induced by the magnetic field are utilized respectively. More particularly, the present invention is applicable to an oscillator, a small capacity motor, a magnetic field sensor and the like, as the form of the semi-conductor device.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A coil integrated semi-conductor or inductive device, comprising:

a semi-conductor substrate;
a first dielectric layer formed on said semi-conductor substrate;
a first metal layer formed on said first dielectric layer, said first metal layer having a predetermined width;
a pair of first contact holes defined respectively on both edges of said first metal layer;
a second metal layer having a central portion formed centrally over said first metal layer and opposed side portions formed respectively on said first contact holes, said second metal layer having a width narrower than that of said first metal layer;
a pair of second contact holes defined respectively on said side portions of said second metal layer, said first and second contact holes having the same width;
a third metal layer formed over said second metal layer, said third metal layer having the same width as that of said first metal layer;
second and third dielectric layers;
said first and third metal layers being connected to each other through said first and second contact holes and by said side portions of the second metal layer formed therebetween, to define a hollow region which is filled with said central portion of the second metal layer disposed centrally therein and a circumferential region surrounding the central portion, said circumferential region being filled with said second dielectric layer at its bottom portion and with said third dielectric layer at the remaining portion; and
said second metal layer being formed of a magnetic material.

2. A coil integrated semi-conductor or inductive device, as set forth in claim 1, wherein said central portion of the second metal layer in said hollow region is used as a core.

3. A coil integrated semi-conductor or inductive device, as set forth in claim 1, wherein said first and third metal layers defining said hollow region are used as a coil.

4. A coil integrated semi-conductor or inductive device, as set forth in claim 2, wherein said magnetic material of the second metal layer is nickel.

5. A coil integrated semi-conductor or inductive device, comprising:
a semi-conductor substrate;
an insulating film formed on said semi-conductor substrate;
a first metal layer formed on said insulating film, said first metal layer having a predetermined width;
a second metal layer formed centrally over said first metal layer, said second metal layer having a width narrower than that of the first metal layer;
a third metal layer formed over said second metal layer, said third metal layer having the same width as that of the first metal layer;
a pair of contact holes defined respectively on both side portions of the first metal layer;
first and second dielectric layers;
said first and third metal layers being connected to each other directly through said contact holes, to define a hollow region which is filled with the second metal layer disposed centrally therein and a circumferential region surrounding the second metal layer, said circumferential region being filled with said first dielectric layer at its bottom portion and with said second dielectric layer at the remaining portion; and
said second metal layer being formed of a magnetic material.

6. A coil integrated semi-conductor or inductive device, as set forth in claim 3, wherein said second metal layer in the hollow region is used as a core.

7. A coil integrated semi-conductor or inductive device, as set forth in claim 5, wherein said first and third metal layers defining the hollow region are used as a coil.

8. A coil integrated semi-conductor or inductive device, as set forth in claim 6, wherein said magnetic material of the second metal layer is nickel.

9. A coil integrated semi-conductor or inductor device, comprising:
a semi-conductor substrate;
a first dielectric layer formed on said semi-conductor substrate;
a first metal layer formed on said first dielectric layer, said first metal layer having a predetermined width;
a second metal layer having a central portion formed centrally over said first metal layer, said second metal layer being formed of a magnetic material;
a third metal layer formed over said second metal layer, said third metal layer having the same width as that of said first metal layer;
second and third dielectric layers; and
said first and third metal layers being connected to each other through at least one pair of contact holes and to define a hollow region which is filled with said second metal layer disposed centrally therein and a circumferential region surrounding the second metal layer said circumferential region being filled with said second dielectric layer at its bottom portion and with said third dielectric layer at the remaining portion.

10. A coil integrated semi-conductor or inductive device, as set forth in claim 9, wherein said first and third metal layers defining said hollow region are used as a coil.

11. A coil integrated semi-conductor or inductive device, as set forth in claim 9 wherein said second metal layer further comprising opposed side portions, said opposed side portions formed respectively on both edges of said first metal layer through a first pair of said contact holes, and a second pair of said contact holes defined respectively on said side portions of said second metal layer, said first and second contact holes having the same width, wherein said first and third metal layers are connected to each other through said first and second contact holes and by said side portions of the second metal layer formed therebetween.

12. A coil integrated semi-conductor or inductive device, as set forth in claim 11, wherein said central portion of the second metal layer in said hollow region is used as a core.

13. A coil integrated semi-conductor or inductive device, as set forth in claim 12, wherein said magnetic material of the second metal layer is nickel.

14. A coil integrated semi-conductor or inductive device, as set forth in claim 9, wherein a pair of said contact holes is defined respectively on both side portions on either side of the second metal layer, wherein said first and third metal layers are connected to each other directly through said contact holes.

15. A coil integrated semi-conductor or inductive device, as set forth in claim 14, wherein said second metal layer in the hollow region is used as a core.

16. A coil integrated semi-conductor or inductive device, as set forth in claim 15, wherein said magnetic material of the second metal layer is nickel.

* * * * *